(12) United States Patent
Reinmuth et al.

(10) Patent No.: US 8,334,534 B2
(45) Date of Patent: Dec. 18, 2012

(54) SENSOR AND METHOD FOR THE MANUFACTURE THEREOF

(75) Inventors: Jochen Reinmuth, Reutlingen (DE); Neil Davies, Sonnenbuehl-Genkingen (DE); Simon Armbruster, Gomaringen (DE); Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 496 days.

(21) Appl. No.: 12/590,585

(22) Filed: Nov. 10, 2009

(65) Prior Publication Data

US 2010/0140618 A1 Jun. 10, 2010

(30) Foreign Application Priority Data

Dec. 10, 2008 (DE) .................. 10 2008 054 481

(51) Int. Cl.
*H01L 31/101* (2006.01)
(52) U.S. Cl. ............ 257/49; 257/E31.057; 438/97
(58) Field of Classification Search ............. 257/49, 257/51, E31.057, E31.043; 438/97
See application file for complete search history.

(56) References Cited

U.S. PATENT DOCUMENTS

2003/0038332 A1* 2/2003 Kimura .................. 257/467

FOREIGN PATENT DOCUMENTS

WO WO 2007/147663 12/2007

* cited by examiner

*Primary Examiner* — Zandra Smith
*Assistant Examiner* — Paul Patton
(74) *Attorney, Agent, or Firm* — Kenyon & Kenyon LLP

(57) ABSTRACT

A sensor includes at least one micro-patterned diode pixel that has a diode implemented in, on, or under a diaphragm, and the diaphragm in turn being implemented above a cavity. The diode is contacted via supply leads that are implemented at least in part in, on, or under the diaphragm, and the diode is implemented in a polycrystalline semiconductor layer. The diode is implemented by way of two low-doped diode regions or at least one low-doped diode region. At least parts of the supply leads are implemented by way of highly doped supply lead regions of the shared polycrystalline semiconductor layer.

14 Claims, 4 Drawing Sheets

SENSOR AND METHOD FOR THE MANUFACTURE THEREOF

BACKGROUND OF THE INVENTION

1. Field of the Invention

The present invention relates to a sensor for spatially resolved detection of IR radiation, and also relates to a method for the manufacture thereof.

2. Description of Related Art

Published international patent application document WO 2007/147663 A1 describes a sensor of this kind having an array assemblage of diode pixels, each diode pixel having a monocrystalline region beneath a cantilevered diaphragm. A pn diode is implemented as a sensitive region in the monocrystalline region. Supply leads of the diodes to combined column and row terminals are provided in or beneath the diaphragm, so that simple addressing and reading of the diode pixels in an array is possible.

Contacting of the p-doped and n-doped regions of each diode pixel is accomplished via metallic supply leads that firstly contact highly doped regions in the monocrystalline regions beneath the diaphragm, by way of which the p- and n-doped regions of the diode are in turn contacted.

Multiple process steps are necessary for manufacture; in particular, firstly a lattice structure is generated, beneath which a region in an epitaxic layer (serving as a sacrificial layer) is porosified, whereupon in a subsequent tempering step, a cavity is implemented in the porosified region and the lattice structure is rearranged into the monocrystalline layer.

A diode array of this kind already makes possible high resolution, e.g. the high spatial resolution of an IR camera. Manufacture is, however, quite complex, especially including implementation of the cavity and of the monocrystalline region beneath the diaphragm.

BRIEF SUMMARY OF THE INVENTION

The present invention implements a diode structure in a polycrystalline semiconductor material, in particular polysilicon. It is thereby possible, in particular, to select a thin-film technology, with the result that, in accordance with the invention, considerably lower costs and a rapid manufacturing method are achievable.

The diode pixels according to the present invention are implemented on a layer structure that advantageously is implementable entirely or largely using CMOS process technology. Known, and in particular also economical, process techniques can thus be applied.

According to an example embodiment, the diode and its supply leads are implemented by different doping in the same polycrystalline semiconductor layer, the supply leads being formed by highly doped supply lead regions, and the pn diodes by, for example, low-doped supply lead regions or also by a low-doped and a highly doped diode region. The different doping can be achieved using known techniques such as, for example, ion implantation and/or diffusion. The highly doped supply lead regions can, in particular, bring about not only electrical contacting but also mechanical suspension of the diode above the cavity.

This is based on the recognition that polycrystalline semiconductor material has much poorer thermal conductivity than, for example, metal, and that good thermal insulation of the diode in a lateral direction can thus be achieved by way of polycrystalline suspension mounts, e.g. in the form of spiral arms, so that the diode is largely thermally insulated, by the cavity at the bottom and by the suspension mount in a lateral direction, with respect to the bulk material. The polycrystalline layer can thus already serve to implement the diode region serving as sensor element, and also the supply leads.

A lower insulating layer, for example, in particular a field oxide implemented on the substrate, can serve as a sacrificial layer for configuring the cavity beneath the polycrystalline semiconductor layer. It is thereby possible to achieve a very simple and compact structure in which firstly a field oxide is thermally implemented in known fashion on a substrate; the polycrystalline semiconductor is implemented, doped, and patterned directly on said oxide; and the cavity is then etched from above through etch openings in the sacrificial layer.

According to the present invention, the implementation of an additional epilayer as a sacrificial layer is in principle not necessary; the field oxide that serves for insulation on the substrate can be used directly. It is, however, entirely possible in principle also to use an additional epilayer as a sacrificial layer.

Further contacting of the highly doped supply lead regions can be accomplished in known fashion, for example, by way of metallizations or also once again using highly doped semiconductor regions. It is thus possible to apply, for example, an upper insulating layer, metallic contacts, and an upper passivating layer onto the polycrystalline semiconductor layer in supplementary fashion.

After implementation of the layer structure, the cavity above the polycrystalline semiconductor layer can firstly be etched in known fashion, and the polycrystalline semiconductor layer having the supply leads (e.g. in the form of spiral arms) can be patterned; the result is to simultaneously expose in the polycrystalline semiconductor layer the etch openings through which the sacrificial layer is subsequently etched using suitable process conditions and a suitable etching gas.

It is thus possible to implement a compact, economical sensor using relatively few process steps, in particular also using CMOS process technology. Implementation of the sensor can, in this context, be combined with the implementation of further circuits on the same substrate, e.g. an evaluation circuit for reception of the sensor signals.

DETAILED DESCRIPTION OF THE INVENTION

Figure 1:
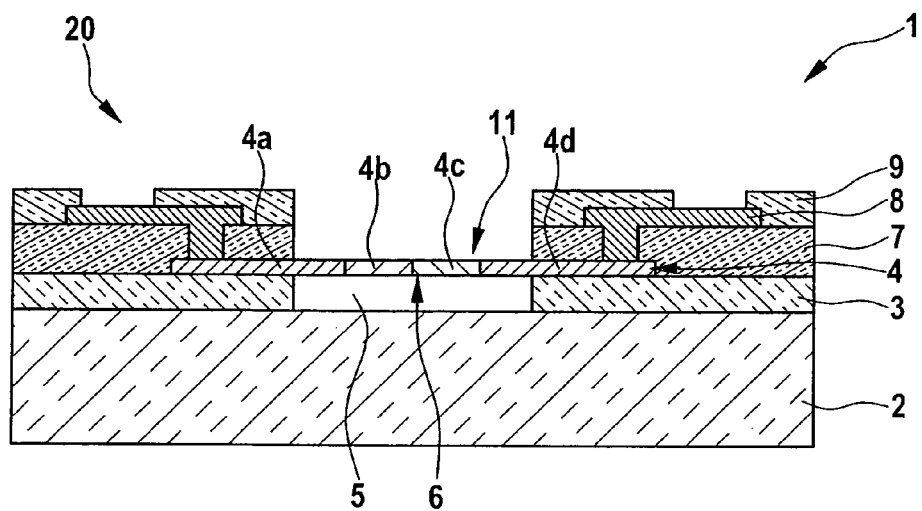
FIG. 1 shows a cross-section through a micropatterned sensor element in accordance with one example embodiment of the present invention.

A sensor 1 has a substrate 2, preferably made of silicon, and has on substrate 2 a patterned layer sequence that has, from bottom to top, firstly a lower insulating layer 3 implemented on substrate 2. Lower insulating layer 3 can be constituted in particular as an oxide layer, preferably as a field oxide layer 3 implemented by oxidation using CMOS process technology, which can e.g. also serve in MOSFETs as a gate oxide layer. Applied onto field oxide layer 3 is a doped polycrystalline semiconductor layer 4 that can be, in particular, a differently doped polysilicon layer 4.

A cavity 5 is implemented in field oxide layer 3 and beneath polysilicon layer 4. Polysilicon layer 4 thus extends partly above cavity 5. In accordance with the embodiment shown, four regions in polysilicon layer 4 are different doped, namely (laterally adjacent to one another) a p+-doped region 4a, a p-doped region 4b, an n-doped region 4c, and an n+-doped region 4d. The two outer, highly-doped regions, i.e. p+-doped region 4a and n+-doped region 4d, serve as supply lead regions 4a, 4d to diode regions 4b and 4c, which together form a diode 6; diode 6 can be formed by low-doped diode regions 4b and 4c, or also by a combination of a low-doped diode region and a highly doped diode region, i.e. $p^0$ diode region 4b and n+ diode region 4c, or p+ diode region 4b and $n^0$ diode region 4c.

Figure 3:
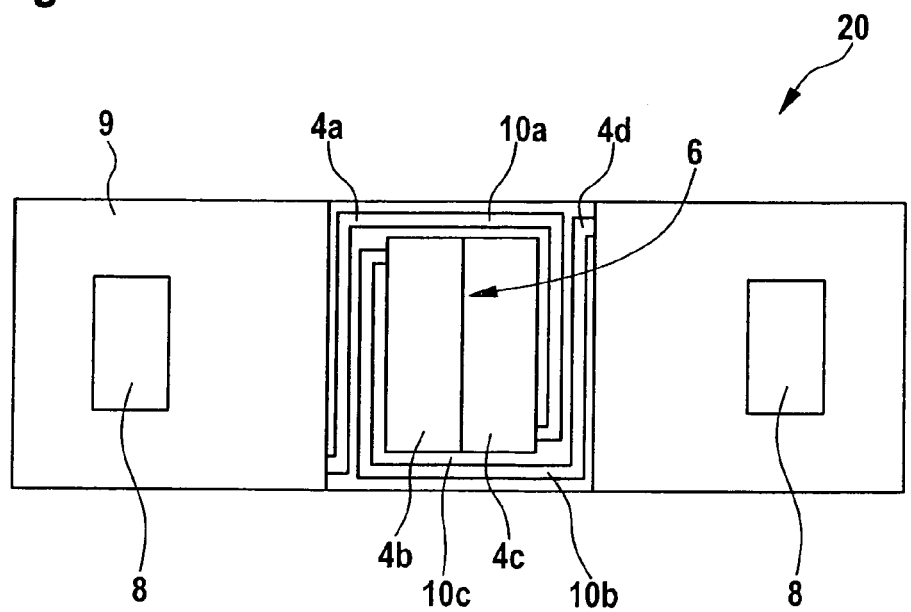
FIG. 3 shows a plan view of the diode element of FIG. 1 according to one example embodiment of a supply lead layout.

The p+ supply lead region 4a thus contacts p-doped diode region 4b, and n+-doped supply lead region 4d contacts n-doped diode region 4c. Diode 6, formed from diode regions 4b, 4c, is advantageously located completely above cavity 5; highly doped supply lead regions 4a, 4d, serving as supply leads, extend from outside to partly above cavity 5. A diaphragm 11 is thus implemented above cavity 5, entirely in polysilicon layer 4. The plan view of FIG. 3 shows an advantageous embodiment in which spiral-arm-shaped suspension mounts or suspension springs 10a, 10b are implemented in highly doped supply lead regions 4a, 4d above cavity 5, and thus mechanically support and at the same time electrically contact diode 6. The fact that the polysilicon of supply lead regions 4a, 4d is a better thermal insulator than, for example, metallic supply leads, as well as the long path length of the spiral configuration, result in good thermal insulation of the cantilevered diode 6.

Applied onto the patterned polysilicon layer 4 is an upper insulating layer 7 that can be constituted, for example, from a glass, e.g. boron-phosphorus-silicate glass (BPSG), or also from a different insulating material. Contacting is accomplished via a metal layer 8 that is applied onto upper insulating layer 7 and contacts highly doped supply lead regions 4a, 4d downward through corresponding cutouts in upper insulating layer 7. A passivating layer 9 made, for example, of silicon oxide is applied in supplementary fashion, e.g. as a layer manufactured using tetraethyl orthosilicate (TEOS).

Figure 2:
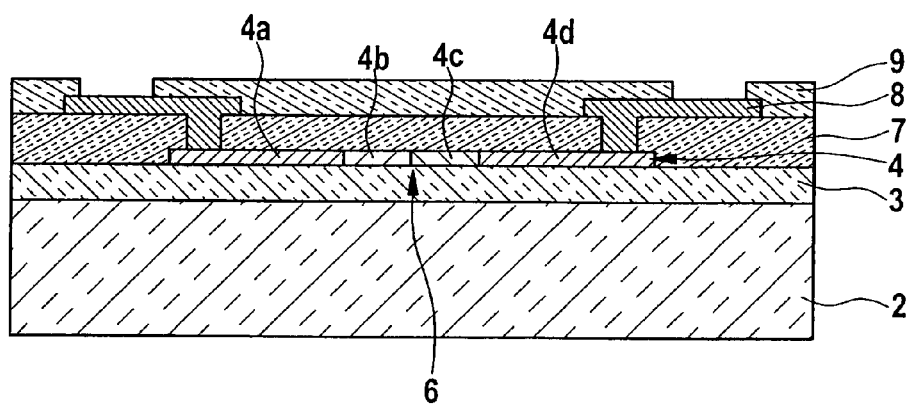
FIG. 2 shows a cross-section of the diode element of FIG. 1 before the exposure process.
Figure 4:
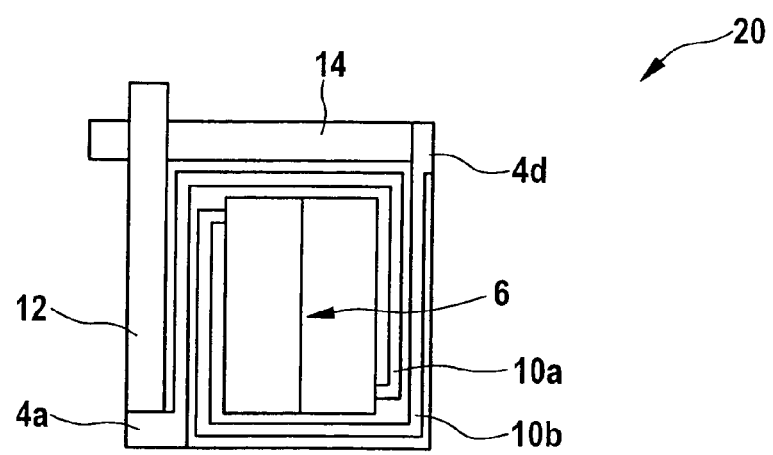
FIG. 4 shows the diode element of FIG. 3 with row and column terminals for matrix connection.
Figure 6:
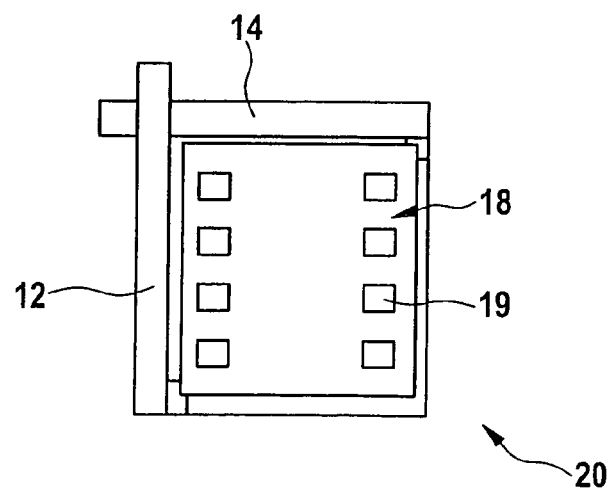
FIG. 6 shows a plan view of the diode element of FIG. 5.
Figure 7:
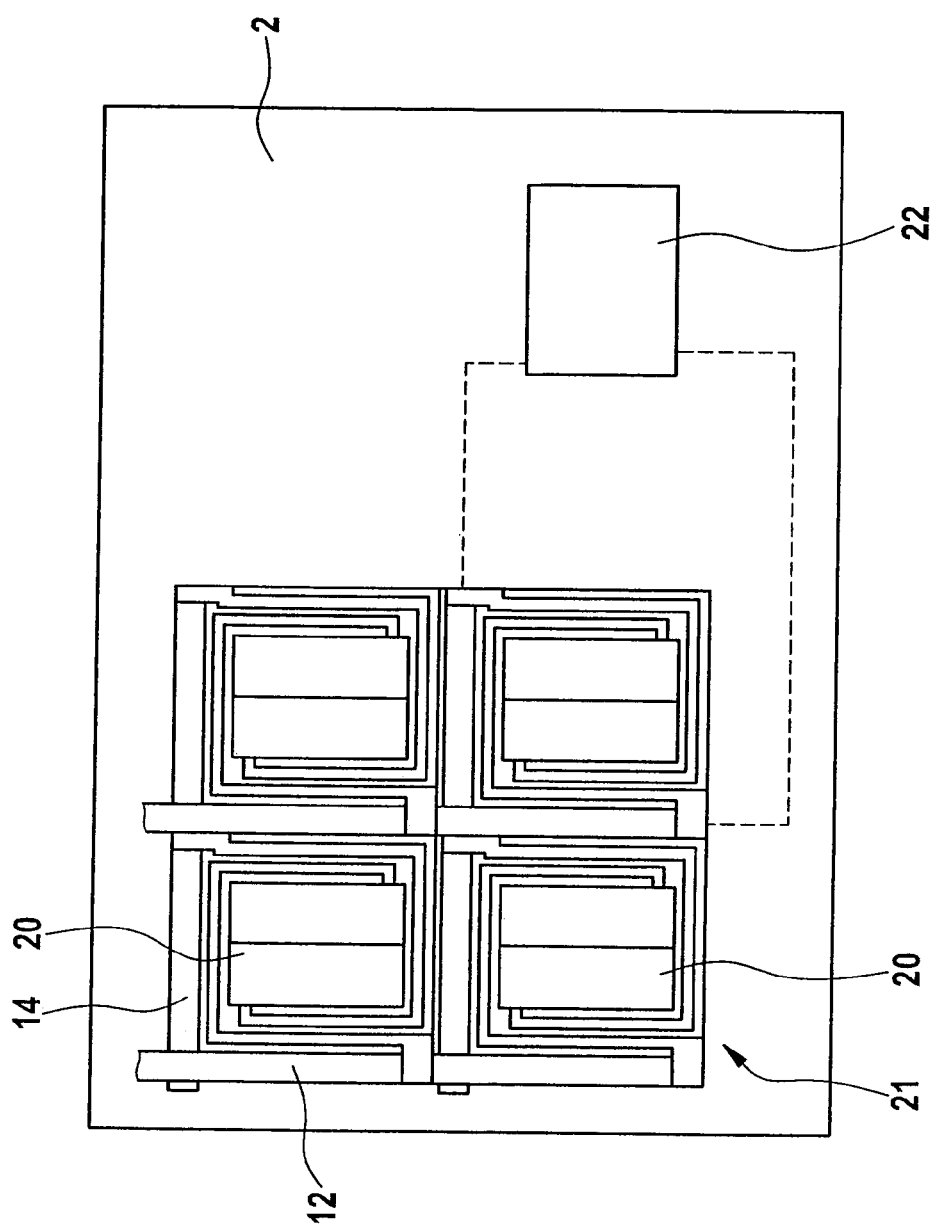
FIG. 7 shows an array assemblage of multiple diode elements.

Sensor 1 can be configured entirely using CMOS technology. For manufacture, firstly the layer sequence of FIG. 2 is implemented, in which field oxide layer 3 is implemented as a sacrificial layer on substrate 2 by oxidation; polysilicon layer 4 is applied, patterned, and doped, e.g. by diffusion or ion implantation; and layers 7, 8, and 9 are applied and patterned. Cavity 5 is then firstly opened above polysilicon layer 4, i.e. in layers 7 and 9, by etching. Polysilicon layer 4 is suitably patterned so that, in accordance with the plan view of FIG. 3, the spiral arm structure having suspension springs 10a, 10b is exposed in supply lead regions 4a, 4d; openings are implemented between said springs as etching accesses 10c through which a suitable etching gas for selective etching of the oxide material of lower insulating layer 3, e.g. hydrofluoric acid (HF) vapor, is introduced. If, as an alternative to the configuration shown, an additional sacrificial layer (e.g. silicon-germanium) is applied on lower insulating layer 3, it is possible to etch using, for example, $ClF_3$, since the silicon-germanium material is etched more quickly than the silicon material of polysilicon layer 4 and, with suitable pressure adjustment, the desired under-etching can thus be effected. Sensor 1 in FIGS. 1 and 3 thus has a single diode pixel 20; sensor 1 according to the present invention can also, however, in accordance with FIG. 4, have multiple diode pixels 20 that are embodied in an array or matrix assemblage with shared column terminals 12 and row terminals 14. This therefore makes possible a sensor having high spatial resolution. FIG. 7 schematically shows a diode pixel array 21 of multiple diode pixels 20 of FIG. 6. A large number of pixels can be correspondingly constituted in this context for a corresponding spatial resolution. Because, according to the present invention, manufacture is possible using only CMOS process steps, an evaluation circuit 22 that reads out the sensor signals can also already be implemented in supplementary fashion on the same substrate 2; the process steps for implementing diode pixel array 21 and evaluation circuit 22 can correspondingly be used in shared fashion.

Figure 5:
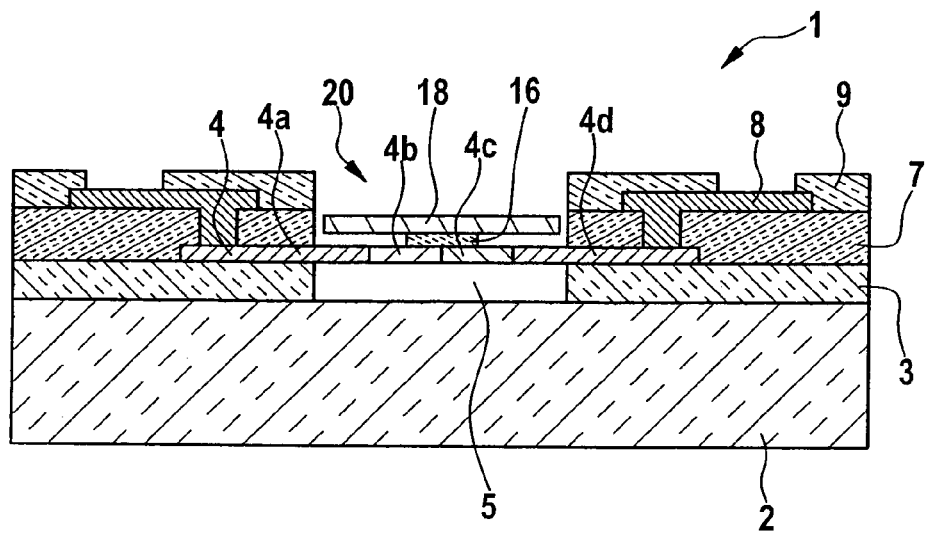
FIG. 5 shows, in a cross-sectional view, a diode element corresponding to FIG. 1 having an additional absorber.

Diode 6 made up of regions 4b, 4c can directly absorb incident IR radiation. As shown in FIGS. 5 and 6, an absorber material can be applied in supplementary fashion onto the exposed polysilicon layer 4. This can occur in particular after the exposure of cavity 5 above polysilicon layer 4; for example, an oxide layer 16 is applied on polysilicon layer 4 and then a polyabsorber layer 18, with suitable patterning to implement perforation holes 19 for subsequent etching of lower insulating layer 3 that serves as a sacrificial layer.

Incident IR radiation thus heats either absorber layer 18 or, directly, the pn diode 6 of each diode pixel 20, the electrical resistance of which changes as a function of its temperature and thus of the intensity of the incident IR radiation.

Suspension springs 10a, 10b can be attached to the bulk material, for example, via LOCOS structures.

What is claimed is:

1. A sensor, comprising:
    at least one micro-patterned diode pixel including:
        a diode implemented one of in, on, or under a diaphragm, wherein the diaphragm is implemented above a cavity, and wherein the diode is implemented in a polycrystalline semiconductor layer; and
        at least two supply leads contacting the diode, wherein:
    the supply leads are implemented at least in part one of in, on, or under the diaphragm;
    at least portions of the supply leads are also implemented in the polycrystalline semiconductor layer;
    the diode includes at least two doped diode regions of the polycrystalline semiconductor layer, at least one of the two doped diode regions being a low-doped diode region; and
    the at least portions of the supply leads include at least two highly-doped supply lead regions of the polycrystalline semiconductor layer.

2. The sensor as recited in claim 1, wherein the doped diode regions of the diode are laterally adjacent to the highly-doped supply lead regions of the polycrystalline semiconductor layer.

3. The sensor as recited in claim 2, wherein the highly-doped supply lead regions form a mechanical suspension mount of the diode.

4. The sensor as recited in claim 3, further comprising:
    spiral-shaped suspension mounts extending above the cavity and implemented in the highly-doped supply lead regions, wherein the spiral-shaped suspension mounts contact and support the diode.

5. The sensor as recited in claim 2, wherein a diode array of multiple diode pixels are implemented on a shared substrate with a shared polycrystalline semiconductor layer.

6. The sensor as recited in claim 5, wherein the diode array has shared column terminals and row terminals for the supply leads of the multiple diode pixels.

7. The sensor as recited in claim 2, further comprising:
an absorber layer for absorption of incident IR radiation, wherein the absorber layer is applied on the diode.

8. The sensor as recited in claim 2, wherein the diaphragm is formed exclusively from the polycrystalline semiconductor layer.

9. The sensor as recited in claim 2, further comprising:
at least one lower insulating layer provided on a shared substrate, wherein the polycrystalline semiconductor layer is provided on the lower insulating layer;
at least one upper insulating layer provided above the polycrystalline semiconductor layer; and
a conductive supply lead layer provided above the upper insulating layer and contacted to the highly-doped supply lead regions of the polycrystalline semiconductor layer.

10. The sensor as recited in claim 2, wherein the diode pixel is produced using CMOS process technology.

11. The sensor as recited in claim 2, further comprising:
an evaluation circuit implemented on a shared substrate, wherein the sensor is produced using CMOS process technology.

12. The sensor as recited in claim 7, wherein the sensor is configured for spatially resolved detection of IR radiation.

13. A method for manufacturing a sensor, comprising:
providing a lower insulating layer on a substrate;
selectively doping and patterning a polycrystalline semiconductor layer having at least one diode with a plurality of doped regions, at least one of which is a low-doped diode region and at least two of which are highly-doped supply lead regions;
applying at least one upper insulating layer on the polycrystalline semiconductor layer;
providing a conductive contacting layer contacted to the highly-doped supply lead regions of the polycrystalline semiconductor layer;
at least partly exposing the polycrystalline semiconductor layer and etching openings in the polycrystalline semiconductor layer; and
etching a cavity beneath the polycrystalline semiconductor layer to implement a diaphragm including the at least one diode.

14. The method as recited in claim 13, wherein the sensor is implemented using CMOS process steps.

* * * * *